United States Patent [19]
Yen et al.

[11] Patent Number: 5,691,216
[45] Date of Patent: Nov. 25, 1997

[54] INTEGRATED CIRCUIT SELF-ALIGNING PROCESS AND APPARATUS

[75] Inventors: Lee-Wei Yen, Taipei; Wu-An Weng, Hsinchu, both of Taiwan

[73] Assignee: Macronix International Co., Ltd., Hsinchu, Taiwan

[21] Appl. No.: 452,999

[22] Filed: May 30, 1995

[51] Int. Cl.$^6$ .................................................. H01L 21/265
[52] U.S. Cl. ........................... 437/45; 437/52; 437/48
[58] Field of Search ........................... 437/48, 45, 52, 437/984; 257/390, 391

[56] References Cited

U.S. PATENT DOCUMENTS 5,117,389 5/1992 Yui ............................................. 365/104
5,306,657 4/1994 Yang ............................................. 437/52

OTHER PUBLICATIONS

Stanley Wolf and Richard Tauber, Silicon Processing for The VLSI ERA vol. 1: Process Technology, Lattice Press, 1986, pp. 407–408.
Wolf, et al., "Refractory Metals and Their Silicides in VLSI Fabrication", Silicon Processing for VLSI ERA, 1:384–391 (1986).

Primary Examiner—John Niebling
Assistant Examiner—Joni Y. Chang
Attorney, Agent, or Firm—Wilson Sonsini Goodrich & Rosati

[57] ABSTRACT

Alignment structures in gaps between patterned features, such as polysilicon wordlines or metal contacts, have a selective effect on various processes to promote self-alignment. The various processes include ion implants for code programming, formation of via cuts, and the polycide process of forming composite layered gates. The alignment structures improve these processes by having a selective effect during etching, deposition, and ion implants. Thus, in one example, to prepare a ROM array for code programming using the ion implantation process, the alignment structures or ion barrier walls are formed between the plurality of wordlines. These ion barrier walls, typically silicon nitride or silicon dioxide, have a height above the substrate that is greater than the height of the wordlines. When viewed from a direction orthogonal to the substrate, only the ion barrier walls and wordlines are visible. Thus, despite mask misalignment or critical dimension variations, the ion barrier walls increase the process window for the code programming step of the mask ROM manufacturing process, minimize code programming or ion implant errors, and facilitate ion implant alignment in selected channel regions to provide uniform channel widths among similarly coded channel regions. Furthermore, the ion barrier walls provide additional contact and support surface area for the mask.

15 Claims, 8 Drawing Sheets

INTEGRATED CIRCUIT SELF-ALIGNING PROCESS AND APPARATUS

BACKGROUND OF THE INVENTION

1. Field of the Invention

The present invention relates to the alignment and positioning of small features in manufacturing of integrated circuit devices, including to the alignment of code programming means used in fabrication of non-volatile read-only-memory (ROM) devices.

2. Description of Related Art

Various processes are available for fabricating integrated circuit devices. When masks or low dimensions of the integrated circuit are involved, alignment and selectivity at several stages of these processes are significant factors that affect the yield of the integrated circuit.

One example of a process that requires selectivity and alignment is ion implantation. A number of integrated circuit non-volatile memory devices require ion implantation for programming selected code into selected cells. One type of integrated circuit non-volatile memory device is a mask-programmable read-only-memory (ROM) device. A mask-programmable ROM is a non-volatile memory device that retains data even if power is removed from the device. One example of a ROM implementation using flat cell design is disclosed in U.S. Pat. No. 5,117,389, issued to inventor Tom D. H. Yiu on May 26, 1992, and titled "Flat-Cell Read-Only-Memory Integrated Circuit." Typically, a ROM array is implemented with a plurality of metal-oxide-semiconductor (MOS) transistors, or memory cells, arranged as an array of bitlines and wordlines. A single memory cell stores a bit of data.

Each MOS device or memory cell can be mined on (i.e. allow electrical current to conduct between the source and the drain) by applying a voltage $V_{GS}$ to its gate that is higher than its threshold voltage. If the applied voltage $V_{GS}$ is lower than the threshold voltage, the MOS device is not turned on. To program code into ROMs during the manufacturing process, various code programming techniques, such as mask programming, are employed.

Mask programmability may be achieved by implanting desired ions (e.g., boron ions) into the channel regions of selected memory cells to turn the transistors permanently off or on; that is, ion implantation is used to alter the threshold voltage of MOS devices representing particular memory cells. As an example, a mask, such as a photosensitive organic material called a photoresist, is used to cover those memory cells during the code ion implantation step where ion implantation is not desired. In this example, a logic 1 (or voltage HIGH) is stored in those memory cells covered by the mask. In unmasked areas, however, ions are implanted into the channel regions which raise the threshold voltage levels of those memory cells. A logic 0 (or voltage LOW) is stored in these higher threshold voltage level memory cells. Usually, the ion implantation step occurs through the polysilicon gate just before the contact etch step.

As integrated circuit fabrication technology evolves, the size of integrated circuit devices decreases. Smaller integrated circuit devices result in errors during the code ion implantation step in the mask ROM manufacturing process for various reasons. First, the critical dimensions of the photoresist masks vary widely; that is, the precise shape and dimensions of the photoresist masks used for programming cannot be assured. Second, misalignment of the photoresist masks results in undesired ion implants in some memory cell locations and no ion implants in memory cell locations where ion implants are desired. Third, smaller integrated circuit devices provide less contact and support surface area for photoresist masks resulting in peeling and misalignment. Inaccurate ion implantation results in lower die yields; a die fails if an error of 1 bit or more occurs. Fourth, smaller integrated circuits provide smaller processing windows and hence, a lower tolerance for errors in mask shifts and mask sizes. As the size of the ROM is decreased, the control of the code programming step during the mask ROM manufacturing process increases in difficulty with current technology.

Another consequence of smaller processing windows and less than optimal programming of these memory devices is the effect on peripheral circuits coupled to these memory devices. One such circuit is a sense amplifier. Sense amplifiers are used with memory devices, especially ROM or RAM devices, for loading and fast switching purposes. For loading, the signal strength of the data read from a memory device may not be strong enough to drive a highly loaded external circuit; thus, the sense amplifier amplifies the data signal. For switching, the readout of a cell in a memory device may not be fast enough for other circuits relying on the stored data; thus, sense amplifiers provide fast switching of data from the memory cell to other external circuits. However, varying channel widths of the channel regions imply varying channel resistances. Thus, even if programming is correct, high channel resistances may require more power from sense amplifiers and other readout circuitry to obtain the same level of voltage and current necessary to read the data.

As ROMs with higher densities and smaller sizes are expected, a need in the integrated circuit technology industry exists for a higher yield and improved mask ROM code programming technology. Current code programming errors due to critical dimension variation, mask misalignment, and photoresist peeling must be minimized without adding significant manufacturing costs.

SUMMARY OF THE INVENTION

The present invention is a self-aligning integrated circuit fabrication technique and device which has a selective effect on various fabrication processes. Thus, the present invention improves upon processes that include removal of material (e.g. formation of via cuts), implantation of a doping material (e.g. mask ROM code programming), and deposition of a material (e.g. polycide process). For ROMs, the invention is applicable for NAND type, NOR type, and X type.

In one embodiment, the present invention overcomes the traditional mask problems of critical dimension variation and mask alignment shift during the code programming step. Moreover, the incidence of photoresist peeling will decrease and adhesion of the mask to the integrated circuit during code programming will increase.

The present invention can be characterized as a method of preparing a non-volatile memory device with a mask, where the memory device has a plurality of wordlines and bitlines fabricated on a substrate to provide a plurality of channel regions. One example of a non-volatile memory device is a mask read-only-memory (ROM) using flat cell design. The process involves forming a plurality of ion barrier elements between the plurality of wordlines in the memory device, where the ion barrier elements substantially prevent ions from penetrating through and into the substrate between the plurality of wordlines during code programming. These ion barrier elements also prevent laterally-scattered ions from implanting in channel regions adjacent the ion barrier elements.

This step of forming the ion barrier elements includes aligning the ion barrier elements between the plurality of wordlines such that the ion barrier elements are in contact with the plurality of wordlines. This step of aligning includes facilitating self-alignment of ion implants in selected channel regions during code programming to substantially minimize code programming errors and establish desired threshold voltage levels in the selected channel regions. The step of aligning also includes facilitating self-alignment of ion implants in selected channel regions during code programming to provide substantially uniform channel widths among similarly coded channel regions. The channel regions are similarly coded when logic levels of code programmed data are equivalent; that is, the channel widths of channel regions storing logic 1 are equivalent to each other and the channel widths of channel regions storing logic 0 are equivalent to each other.

The step of forming the ion barrier elements further includes providing increased contact area on the ion barrier elements for code programming masks which increases adhesion to substantially minimize peeling of the masks. Alternatively, the step of forming the ion barrier elements includes forming an ion barrier layer on the plurality of wordlines, where the ion barrier layer is at a first height greater than the height of the plurality of wordlines measured from the substrate. Another step includes removing a portion of the ion barrier layer to form the ion barrier elements and expose the plurality of wordlines when viewed from a direction orthogonal to the substrate, where the ion barrier elements are at a second height that is at least equal to or greater than the height of the plurality of wordlines when measured from the substrate. An exemplary second height is at least 1000 Å. This latter step of removing includes removing the ion barrier layer until the plurality of end point detection elements are exposed when viewed from a direction orthogonal to the substrate, and removing the plurality of end point detection elements to expose the plurality of wordlines when viewed from a direction orthogonal to the substrate.

Additional steps include forming a plurality of end point detection elements on the plurality of wordlines, and forming the ion barrier layer on top of and around the plurality of wordlines and the plurality of end point detection elements. Some exemplary materials include silicon nitride or silicon dioxide for the ion barrier layer, ion barrier elements, and the end point detection elements.

Another aspect of the present invention is a method of forming a read-only-memory (ROM) array in preparation for code programming the ROM array with a mask. The method steps comprise forming a plurality of bitlines on the substrate; forming a plurality of wordlines substantially perpendicular to the plurality of bitlines; and forming a plurality of ion barrier elements between the plurality of wordlines in the ROM array, the ion barrier elements substantially preventing ions from penetrating through and into the substrate between the plurality of wordlines during code programming.

The step of forming the plurality of bitlines includes forming a sacrificial insulator layer on the substrate; forming a photoresist layer on the sacrificial insulator layer; exposing the photoresist layer with a reacting element through a first mask to define the bitline pattern; implanting ions into a portion of the substrate defined by the bitline pattern; and removing the sacrificial insulator layer and the photoresist mask to form the plurality of bitlines.

The step of forming the plurality of wordlines includes forming an insulator layer on the plurality of bitlines and the substrate; forming a wordline layer on the insulator layer; forming an end point detection layer on the wordline layer; forming a photoresist layer on the end point detection layer; exposing the photoresist layer with a reacting element through a second mask to define the wordline pattern; forming the plurality of wordlines and a plurality of end point detection elements on the plurality of wordlines based on the wordline pattern; and removing the photoresist layer.

The steps of forming the ion barrier elements are as described above, with and without the interaction with the end point detection elements.

A further aspect of the present invention is a ROM array on a substrate prepared for code programming. The ROM array comprises a plurality of bitlines, a plurality of wordlines arranged substantially perpendicular to the plurality of bitlines for forming channel regions on the substrate located between the plurality of bitlines and orthogonal to the plurality of wordlines, an insulator layer coupled between the plurality of bitlines and the plurality of wordlines, and an ion barrier element formed between the plurality of wordlines in the ROM array, where the ion barrier elements substantially prevent ions from penetrating through and into the substrate during code programming. The ion barrier elements provide uniform channel widths of similarly coded channel regions.

The present invention can also be characterized as a product-by-process ROM array fabricated in preparation of code programming. The steps are as described above for forming the ROM array.

The present invention can also be characterized as a method for manufacturing a device with a self aligned process. The steps include: (a) forming a pattern of features on a substrate with gaps between features in the pattern, where the features include a first material; (b) filling gaps in the pattern at least partially with a fill material to form alignment structures self aligned with the features in the pattern, where the fill material is characterized by a particular process which has a selective effect on the fill material relative to the first material; and (c) applying the particular process to the pattern so that alignment of the particular process is controlled by the selective effect of the particular process on the alignment structures relative to the first material. The features in the pattern include wordlines in a memory array and the alignment structures block implantation between the wordlines.

Additional steps in the method include: (d) providing a second layer of material on the first material in the pattern of features, where the first material has a top surface, and the second layer of material is selectively etchable relative to the first material and relative to the fill material; (e) filling the gaps in the pattern with the fill material to a level above the top surface of the first material; and (f) selectively removing the second layer of material from the features in the pattern prior to applying the particular process, leaving the pattern in the first material with the alignment structures thicker than the pattern in the first material.

The particular process can include removal of material, implantation of a doping material, and deposition of a material on one of the features in the pattern or the alignment structures. Moreover, the particular process includes depositing an isolation material over the pattern and the alignment structures, the isolation material being selectively etchable relative to the alignment structures and the first material; and etching the isolation material in a pattern to create vias for contact to the first material, the vias being self aligned between the isolation structures. Another example of the particular process is applying a mask with an alignment tolerance over the pattern in the first material and the alignment structures which exposes selected portions of the pattern in the first material; and treating the selected portions of the pattern in the first material with the particular process so that the alignment structures compensate for misalignment of the mask within the alignment tolerance.

BRIEF DESCRIPTION OF THE DRAWINGS

The method and apparatus of the present invention may be better understood with the aid of the following text and accompanying drawings, FIGS. 1–20.

FIG. 9 shows code programming errors due to misalignment of the mask across a portion of several wordlines on imaginary reference line C—C' of FIG. 6.

FIG. 10 shows code programming errors of a portion of the ROM array due to the small size of the masks along the imaginary reference line C—C' of FIG. 6.

FIG. 11 shows code programming errors of a portion of the ROM array due to the large size of the masks along the imaginary reference line C—C' of FIG. 6.

FIG. 22 shows how the present invention improves the polycide process as selected material is deposited on the pattern or the alignment structure.

DETAILED DESCRIPTION OF PREFERRED EMBODIMENTS

The present invention promotes self-alignment with an alignment structure which has a selective effect on various processes which thereby improves those processes. One example of the selective effect involves code programming of a mask ROM array. The present invention is applicable to, among others, NAND, NOR, and X type mask ROMs.

During the code programming step of a mask ROM manufacturing process, the present invention increases the reliability of data (logic 1 or 0) implanted in the memory cells of the ROM array and provides uniform channel widths of channel regions from one memory cell to another in the entire ROM array despite critical dimension variation and mask alignment shifts. Thus, a memory cell storing a logic 1 (voltage HI) has a substantially similar channel width with other memory cells storing logic 1 (voltage HI). Similarly, a memory cell storing a logic 0 (voltage LO) has a substantially similar channel width with other memory cells storing logic 0 (voltage LO). Additionally, the present invention decreases the incidence of photoresist peeling and increases adhesion of masks to the ROM array.

Figure 1:
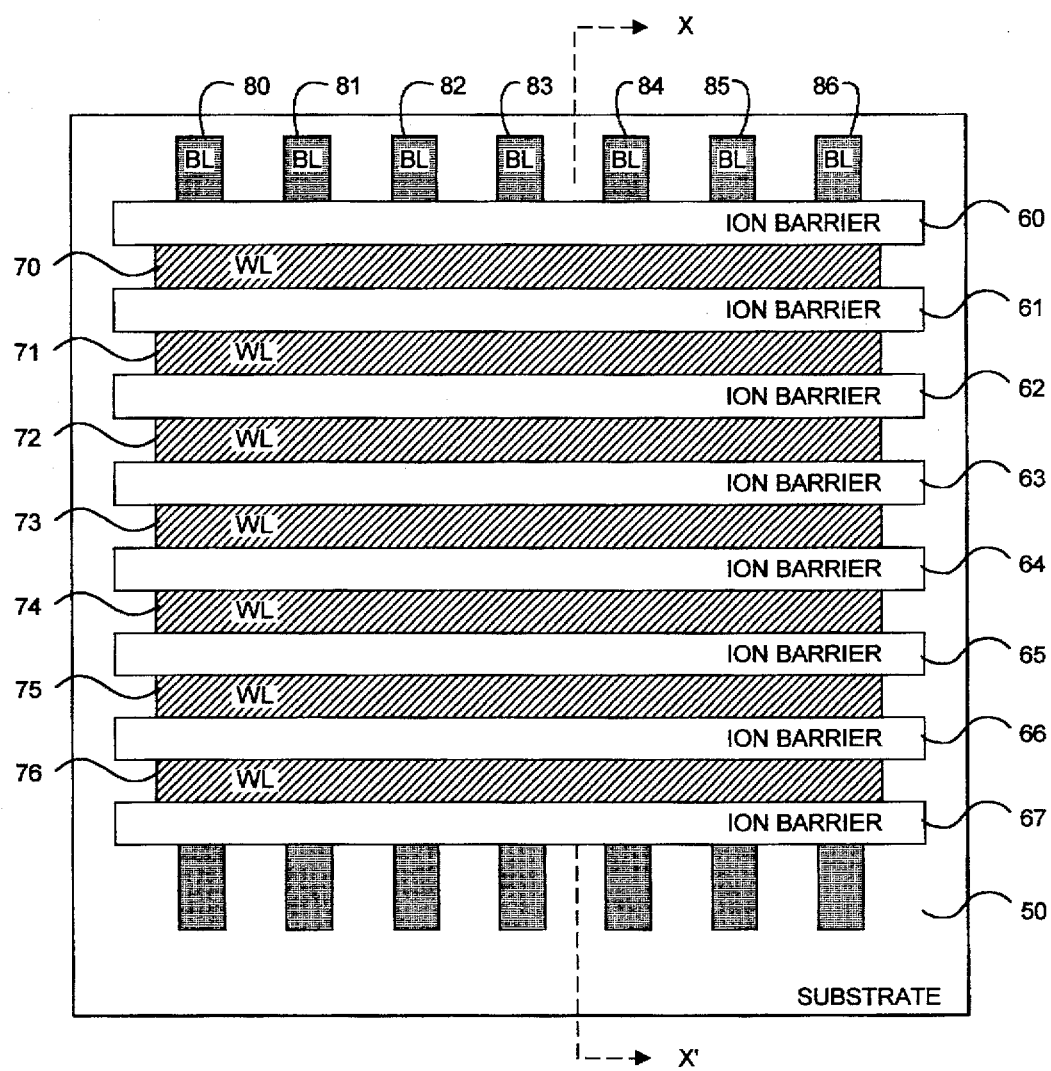
FIG. 1 is a top view of a non-volatile integrated circuit, such as a ROM array, with an embodiment of the present invention.
Figure 2:
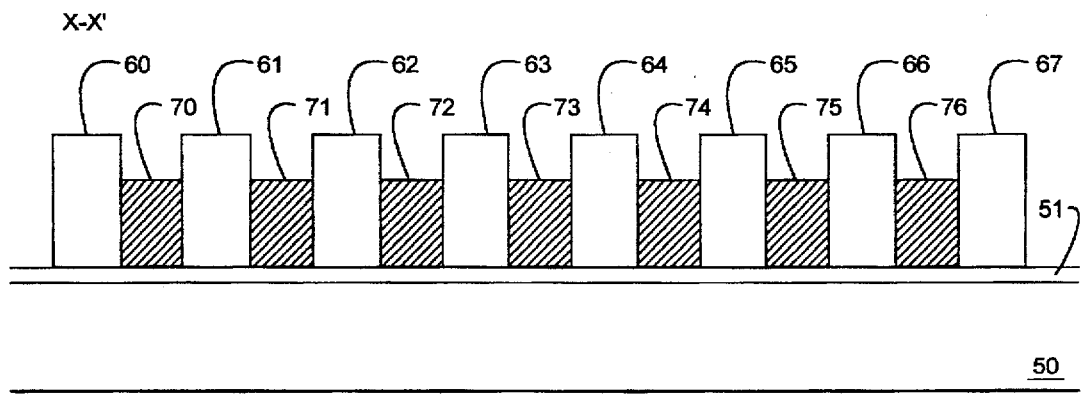
FIG. 2 is a side view along the imaginary reference line X—X' of FIG. 1.

FIGS. 1–20 are not drawn to scale; rather, they are drawn for illustrative purposes only to accompany the description of the ROM array, code programming and channel width shrinkage problems, and the embodiments of the present invention. FIGS. 1 and 2 show an embodiment of the present invention. In particular, FIG. 1 shows a top view of one final result of executing one of the methods of the present invention. A non-volatile memory device, such as a ROM array using a flat cell design, is shown in FIG. 1 with a plurality of bitlines 80–86 and a plurality of wordlines 70–76 positioned substantially perpendicular to the plurality of bitlines 80–86 on a silicon substrate 50. As known to those ordinarily skilled in the art, the plurality of bitlines 80–86 and the plurality of wordlines form channel regions located in the substrate between the bitlines and under or orthogonal to the wordlines. To prepare this ROM array for code programming via ion implantation, executing the processing steps described herein results in the ion barrier elements 60–67 formed between the plurality of wordlines 70–76. Usually, the heights of these ion barrier elements 60–67 are greater than the heights of the wordlines 70–76 measured from the substrate. Code programming then begins after placing masks on desired channel regions.

FIG. 2 shows a side view of the ROM array and ion barrier elements along the imaginary reference line X—X' of FIG. 1. As shown, an insulator 51 is placed on substrate 50. The plurality of wordlines 70–76 are processed on top of the insulator 51. Thereafter, the processing steps of one embodiment of the present invention result in the ion barrier elements 60–67 formed between the wordlines 70–76 to increase the processing window, substantially minimize ion implant errors, and facilitate the self-alignment of ion implants.

Figure 3:
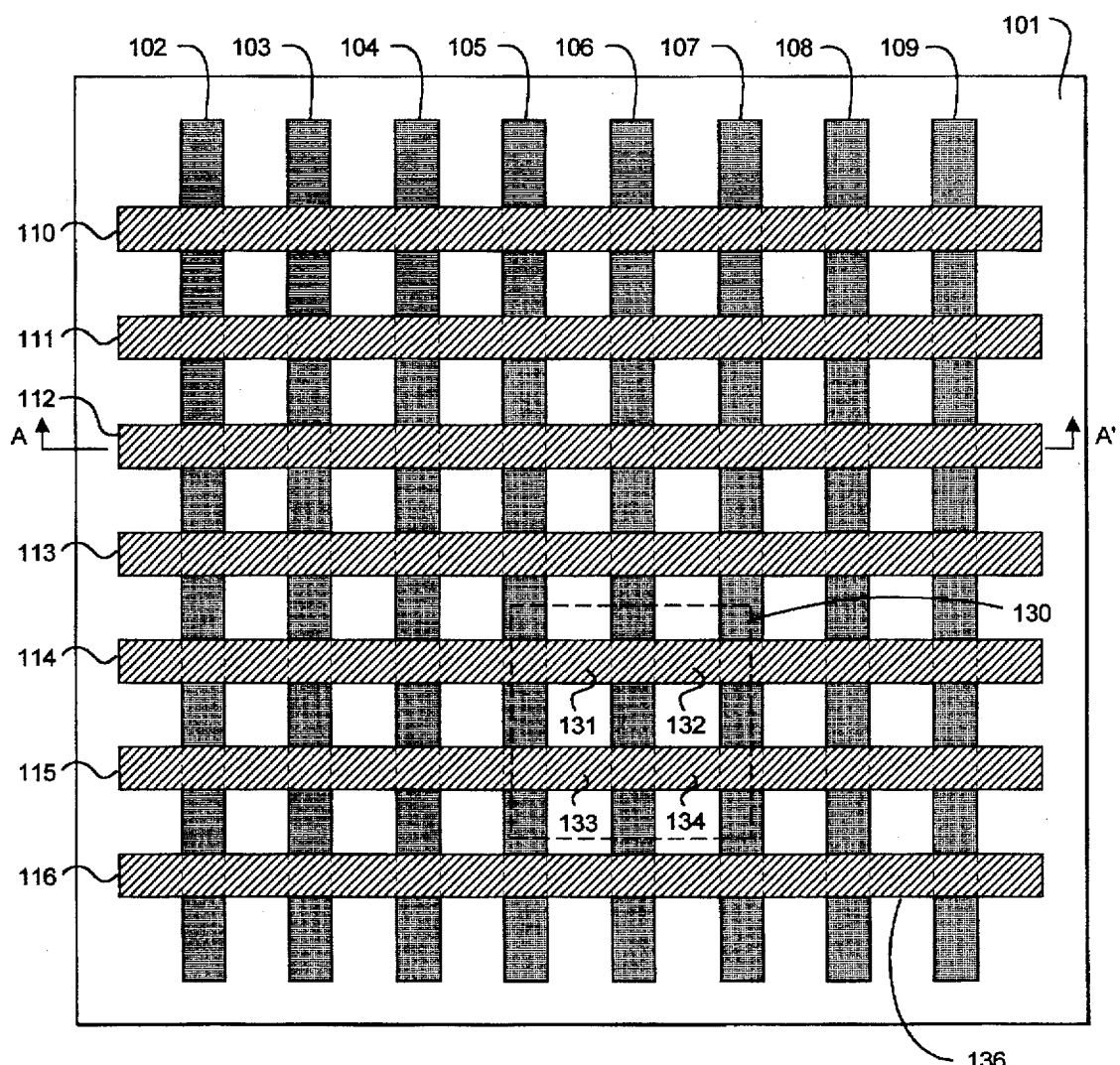
FIG. 3 shows a top view of a mask ROM array showing the wordlines and bitlines fabricated on a substrate.

FIG. 3 shows a top view of a mask ROM array structure without the metal contacts and power/ground connections. In this example, a metal-oxide-semiconductor (MOS) transistor, representing a memory cell, can store logic data 1 or 0 depending on its connection to the remainder of the circuit and its threshold voltage level. These MOS transistors are fabricated from diffusion regions overlapped by polysilicon layers; thus, buried diffusion n+ region bitlines are arranged perpendicular to the polysilicon wordlines. Buried diffusion n+ region bitlines can be either a drain or source of the transistors depending on other circuit connections. Wordlines are used to control the gates of the transistors, or memory cells.

In one example of a ROM device, as shown in FIG. 3, a p- substrate 101 is provided. Bitlines 102–109 are fabricated as columns in substrate 101. These bitlines serve as either the drain or source of each transistor. Insulators (not shown in FIG. 3), such as silicon dioxide ($SiO_2$), are then formed on the buried diffusion n+ bitline and substrate 101 layers. Polysilicon is then used as the gate material to form wordlines 110–116. These wordlines are arranged as rows on the substrate 101 and are perpendicular to the bitlines 102–109.

The ROM array of FIG. 3, with its combination of wordlines and bitlines, shows a plurality of n-type transistors. When viewed from a direction orthogonal to the ROM array of FIG. 3, the channel region of each transistor is the region in the substrate 101 immediately below a polysilicon wordline and between any two adjacent bitlines. For example, the region in the substrate below wordline 116 and between bitlines 108 and 109 designated by reference numeral 136 is a channel region for the corresponding memory cell. Typically, the length and width of the channel region are each 0.6 µm.

During the code programming process, boron ion implanted into the channel regions of selected transistors increases the threshold voltage level of those selected transistors. Thus, when the threshold voltage level is higher than the wordline operation voltage, a logic 0 is programmed into the selected memory cell of the ROM array.

Figure 4:
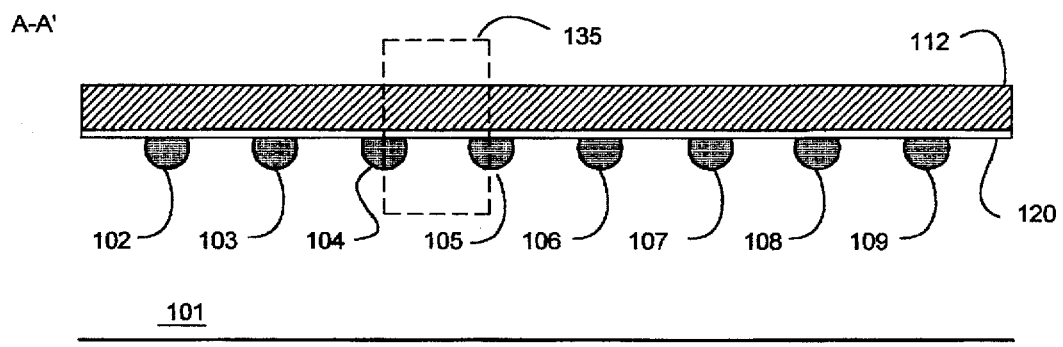
FIG. 4 shows a side view of the mask ROM array along the imaginary reference line A—A' of FIG. 3.

FIG. 4 is a side view along the imaginary reference line A—A' of FIG. 3. Polysilicon wordline 112 rests on insulator 120. Buried diffusion n+ bitlines 102–109 are fabricated in substrate 101 below the insulator 120. A representative memory cell is generally indicated as cell 135 which includes the polysilicon 112 as the gate, insulator 120, bitlines 104 and 105, and substrate 101. The bitlines 104, 105 serve as the source and drain of the cell 135 depending on other circuit connections; for an n-type cell, the most negative terminal is the source. The region in the substrate 101 between the bitlines 104, 105 is the channel region.

Figure 5:
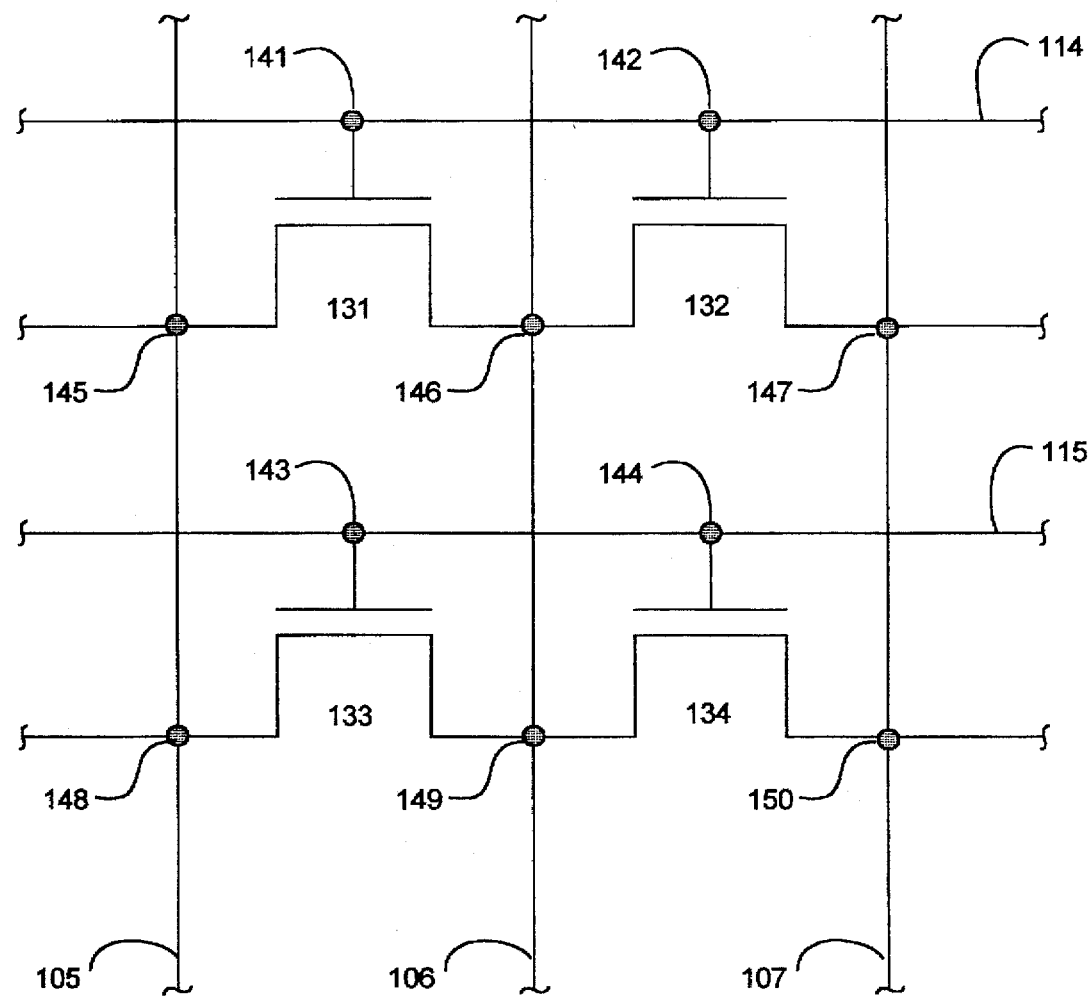
FIG. 5 is an equivalent circuit diagram of a portion of the ROM array of FIG. 3.

FIG. 5 shows an equivalent circuit diagram of one portion of the exemplary ROM array of FIG. 3. Specifically, only that portion generally indicated by the block of dotted lines 130 on FIG. 3 is shown. Power, ground, and other switch connections are not shown. A more detailed and exemplary ROM circuit diagram and integrated circuit layout are disclosed in U.S. Pat. No. 5,117,389, issued to inventor Tom D. H. Yiu on May 26, 1992 and titled "Flat-Cell Read-Only-Memory Integrated Circuit," which is incorporated by reference herein.

Gate/channel regions 131–134 on FIG. 3 are shown as MOS transistors on FIG. 5. Wordlines 114 and 115 (corresponding to the polysilicon layers) are connected to the gates of transistors 131–134. Bitlines 105, 106 and 107 (corresponding to buried diffusion n+ region bitlines) are connected to either the sources or drains of transistors 131–134, depending on the other electrical connections. Thus, wordline 114 is connected to the gates of transistors 131 and 132 via nodes 141 and 142, respectively. Transistor 131 is connected to bitline 105 at node 145 and bitline 106 at node 146. Transistor 132 is connected to bitline 106 at node 146 and bitline 107 at node 147. Wordline 115 is connected to the gates of transistors 133 and 134 via nodes 143 and 144, respectively. Transistor 133 is connected to bitline 105 at node 148 and bitline 106 at node 149. Transistor 134 is connected to bitline 106 at node 149 and bitline 107 at node 150.

Each transistor 131–134 conducts electrical current when the voltage applied to its gate with respect to its source exceeds a particular threshold voltage level. Prior to the code programming process in this example, each transistor has a low enough threshold voltage level such that when the wordline operational voltage is applied to the gate, the transistor conducts and a logic 1 is provided as an output to some decoding circuitry external to the ROM array.

During the code programming process, boron ions implanted into the channel regions of selected transistors raise the threshold voltage level to a level above the wordline operational voltage level. So, when the wordline operational voltage is applied to the gate, no electrical current flows and the transistor provides an output of logic 0.

Figure 6:
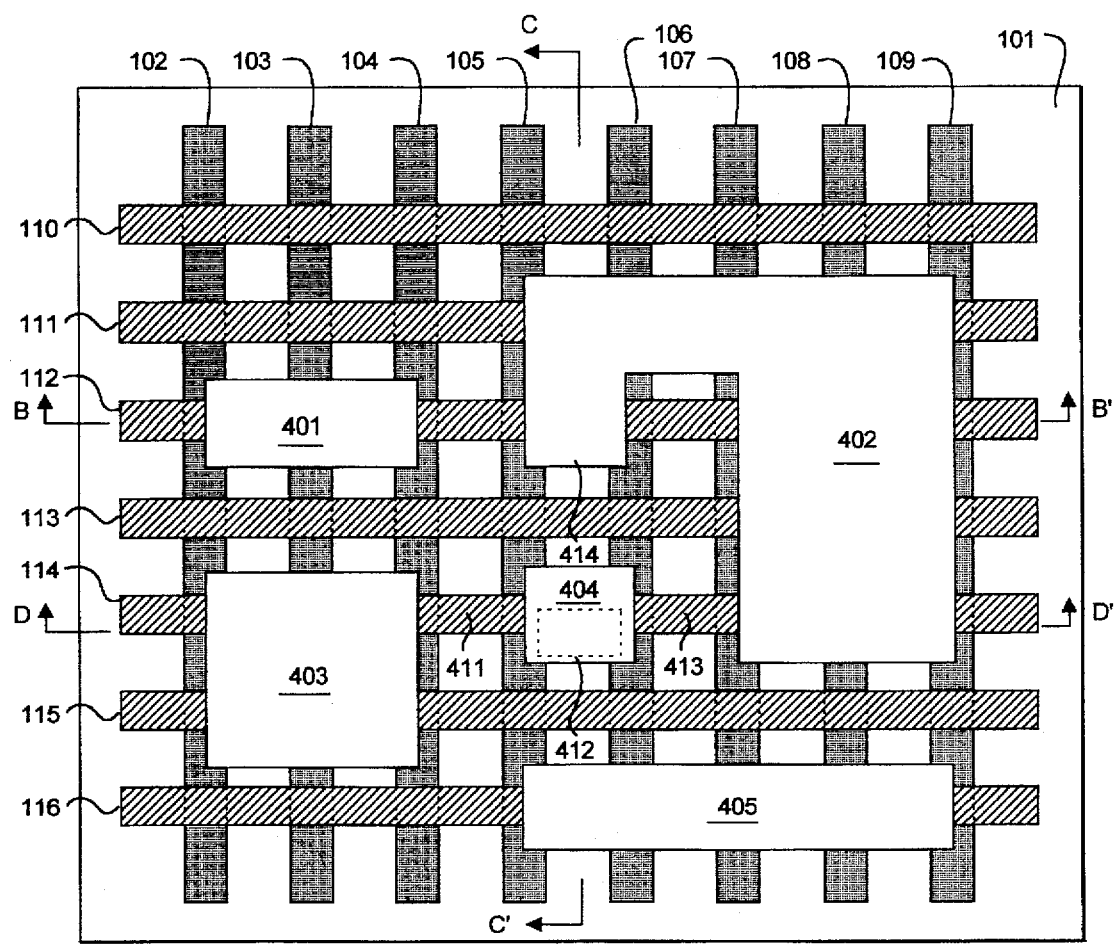
FIG. 6 is a top view of a mask ROM array showing the code masks overlaid on selected memory cells during the code programming process.

FIGS. 4–6 show one example of a code programming, or code ion implantation step, of a mask ROM manufacturing process. FIG. 6 shows a top view of the ROM layout with the photoresist masks covering selected cells on the ROM array. During the code ion implantation process, the photoresist masks 401–405 are used to cover the channel regions of those memory cells that are designed to retain a logic 1 when read. All other channel regions of memory cells that are exposed (not covered by the photoresist masks 401–405) will retain a logic 0 when read due to the ion implant-generated higher threshold voltage levels. Implanting boron ions, for example, into the channel regions of the unmasked memory cells raises the threshold voltage level to a level above the wordline operation voltage such that a logic 0 will be read. In other embodiments, other ions may be used in the code ion implantation step to raise the threshold voltage level of memory cells.

Code programming through ion implantation produces very shallow layers of high doping. The depth and concentration of the doping are very accurately controlled; very light doping concentrations are possible with this procedure. For FIG. 6, assuming the critical dimensions of the photoresist masks 401–405 are adequate and these masks are not misaligned, code programming through ion implantation should yield an error-free ROM. Thus, for example, the exposed memory cell corresponding to gate/channel region 411 stores a logic 0. The masked memory cell corresponding to gate/channel region 412 under the photoresist mask 404 stores a logic 1. The exposed memory cell corresponding to gate/channel region 413 stores a logic 0. The exposed memory cell corresponding to gate/channel region 414 stores a logic 0. When the critical dimensions of the photoresist masks are adequate, these photoresist masks should cover the designated gate/channel region of the selected memory cell and a significant area around the designated gate/channel region to compensate for lateral scattering of ions. So, as an example, photoresist mask 404 covers more than the gate/channel region 412 of the designated memory cell without covering an adjacent memory cell.

Figure 7:
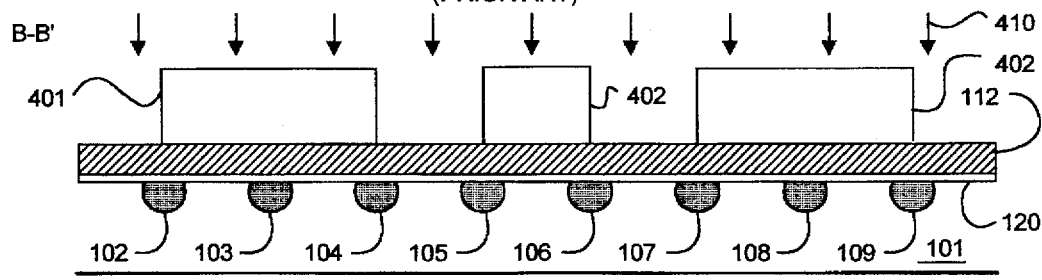
FIG. 7 is a side view along the imaginary reference line B—B' of FIG. 6.

FIG. 7 shows a side view along the imaginary reference line B—B' of the ROM array of FIG. 6. N+ buried diffusion bitlines 102 to 109 are fabricated in substrate 101. Insulator 120 is provided between the bitline/substrate layer and the polysilicon wordline 112. The photoresist masks 401, 402 are provided on the polysilicon wordline 112 at selected cell locations. During the code ion implantation step, boron ions 410 are bombarded into the ROM array. The gate/channel regions between bitlines 104, 105 and also 106, 107 should store a logic 0. In masked regions, a logic 1 will be stored. For example, the gate/channel region under photoresist mask 402 and between bitlines 105, 106 should store a logic 1.

Figure 8:
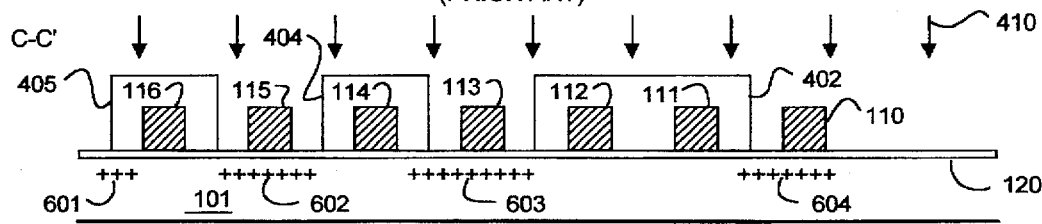
FIG. 8 is a side view along the imaginary reference line C—C' of FIG. 6.

FIG. 8 shows a side view along the imaginary reference line C—C' of the ROM array of FIG. 6. Because imaginary reference line C—C' is located between the diffused bitlines 105, 106 on the substrate 101, FIG. 8 does not show the bitlines. FIG. 8 shows substrate 101 with an insulator 120 and wordlines 110–116. Photoresist masks 402, 404, 405 are located above the selected cell locations to prevent ions 410 from being implanted in their respective channel regions. For example, the memory cells corresponding to the gate/channel regions below wordlines 114, 113 and 112 should store logic 1, 0 and 1, respectively. Implanted boron ions (+)

601–604 are shown. Due to lateral scattering, some ions are implanted under the peripheral edges of the photoresist masks 402, 404 and 405. Lateral scattering occurs because the incident angle at which ions bombard the ROM array varies. Thus, without proper mask critical dimensions and alignment, code programming errors may occur due to ions being implanted in areas not designated for such implants.

Figure 9:
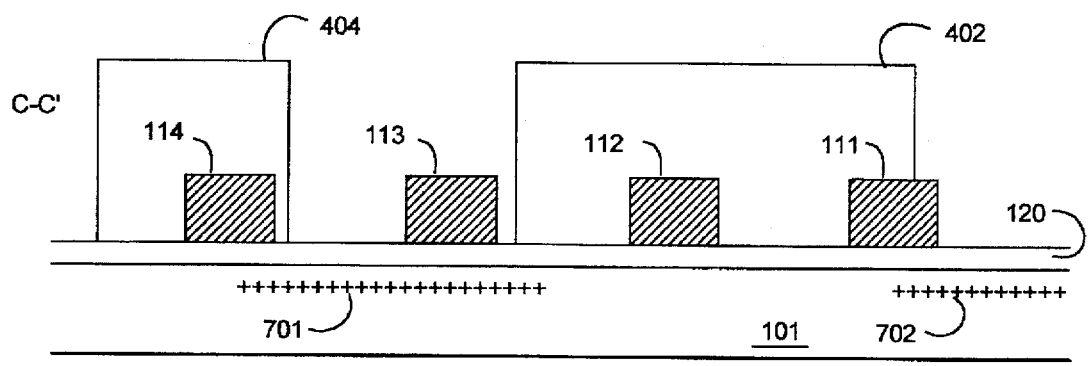
FIGS. 9 to 11 show various problems with the current code programming process. Specifically.
Figure 10:
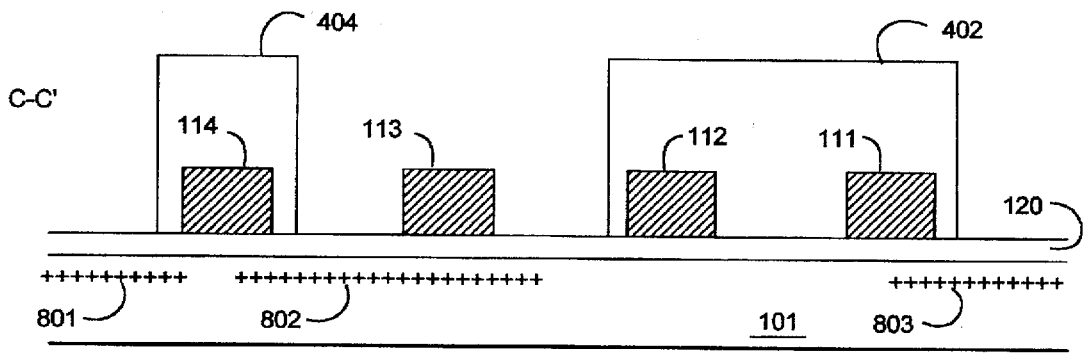
Figure 11:
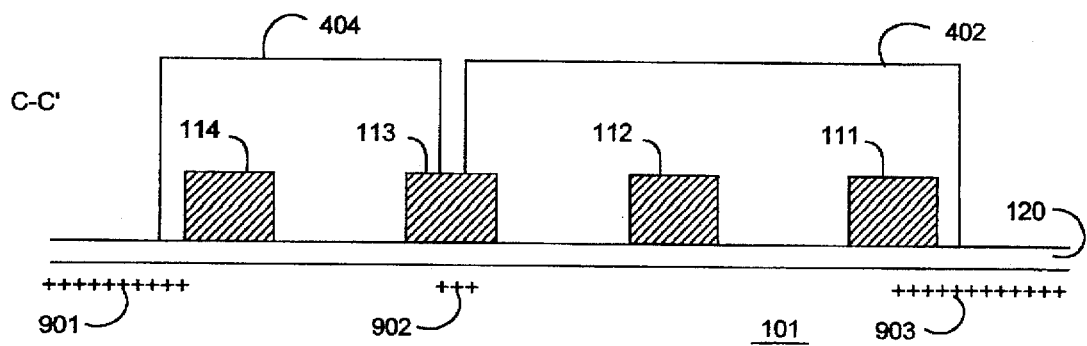

FIGS. 9–11 illustrate the various problems that could arise during the current code programming process. FIGS. 9–11, analogous to FIG. 8, illustrate code programming errors along the imaginary reference line C—C'. These errors arise across several wordlines.

FIG. 9 shows a portion of the ROM array along the imaginary reference line C—C' of FIG. 6. Wordlines 111, 112, 113 and 114 are shown resting on insulator 120. Photoresist masks 402 and 404 are also shown for the code programming. When properly coded, as shown in FIG. 8, the memory cells corresponding to the gate/channel regions below wordlines 114, 113, 112 and 111 should store logic 1, 0, 1 and 1, respectively. For the sake of the discussion of code programming errors accompanying FIGS. 9–11, these proper codes 1, 0, 1, and 1 are used as a reference. In contrast to the properly aligned photoresist masks of FIG. 8, FIG. 9 shows the masks 402, 404 misaligned. Masks 402 and 404 are aligned or shifted more to the left than desired. As shown by the implanted ions 701, 702, errors in code programming can result when the masks 404, 402 are misaligned. Thus, the memory cells corresponding to the gate/channel regions below wordlines 114, 113, 112 and 111 now store logic 0, 0, 1, and 0, respectively. The memory cells associated with gate/channel regions below wordlines 114 and 111 show channel width shrinkage due to the lateral scattering ions implanted therein. With these laterally scattered implants, channel resistance increases, the threshold voltage level is increased, and logic 0 (instead of logic 1) will be stored if the increased threshold voltage level is above the wordline operational voltage.

FIG. 10 shows a portion of the ROM array along the imaginary reference line C—C' of FIG. 6. The same memory cells as in FIG. 9 are shown. Here, code programming errors occur because of the variation in critical dimensions of the masks 404, 402. In particular, FIG. 10 shows code programming errors because the masks 404, 402 are too small. As the implanted ions 801, 802, and 803 show, the memory cells corresponding to the gate/channel regions below wordlines 114, 113, 112 and 111 now store logic 0, 0, 0, and 0, respectively. Again, lateral scattering of ions 801, 802, and 803 cause channel regions to shrink, channel resistance to increase, and hence, threshold voltage levels to increase in the memory cells. The increase in threshold voltage results in logic 0 being stored in these memory cells.

FIG. 11 shows a portion of the ROM array along the imaginary reference line C—C' of FIG. 6. FIG. 9 shows the same memory cells as shown in FIGS. 9 and 10. Here, code programming errors occur because the masks 404, 402 are too large. As shown by the implanted ions 901, 902 and 903, the memory cells corresponding to gate/channel regions below wordlines 114, 113, 112 and 111 now store logic 1, 1, 1, and 1, respectively. For the memory cell corresponding to the gate/channel region below wordline 113, some ions 902 are implanted therein. However, the amount of ions 902 implanted therein may be too low to raise the threshold voltage sufficiently high enough to store a logic 0; therefore, logic 1 will be stored.

FIGS. 12–18 show the fabrication steps and integrated circuit devices of an embodiment of the present invention.

Figure 18:
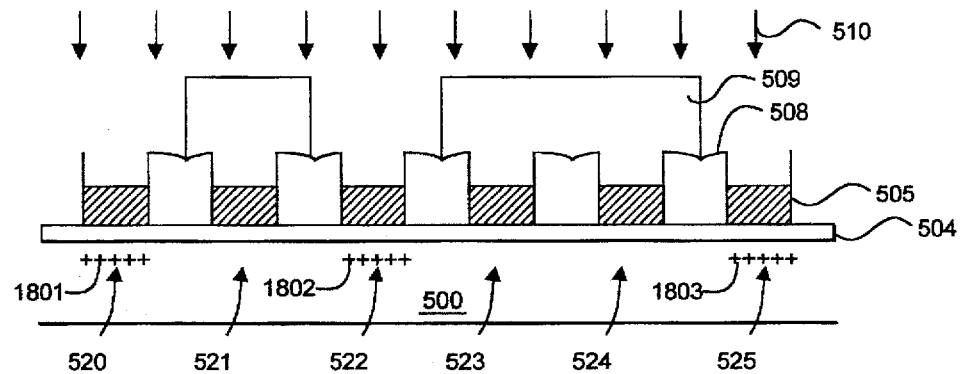
Figure 19:
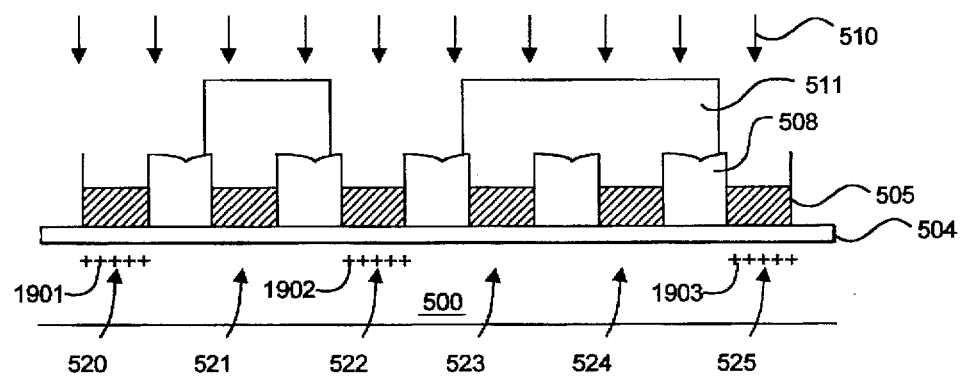
FIG. 19 shows how an embodiment of the present invention secures code integrity during the code programming process in the presence of mask misalignment.
Figure 20:
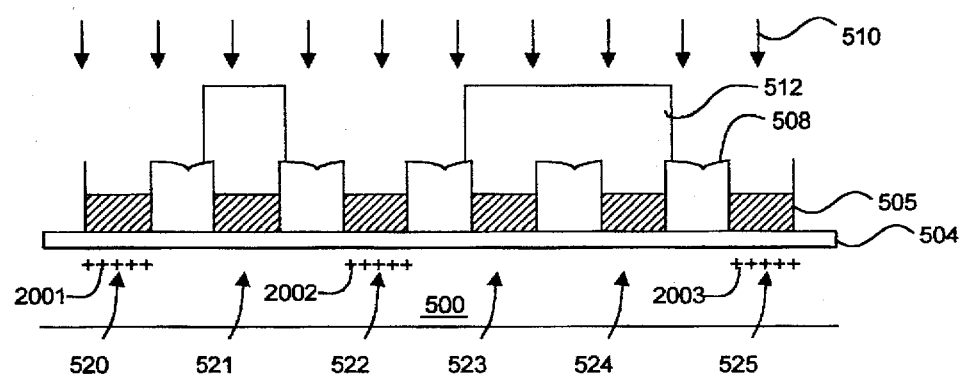
FIG. 20 shows how an embodiment of the present invention secures code integrity during the code programming process even though the masks are too small.

By utilizing high ion barrier walls of the present invention, code errors during the ion implantation step are minimized, as shown in FIGS. 18, 19 and 20 and described below.

Figure 12:
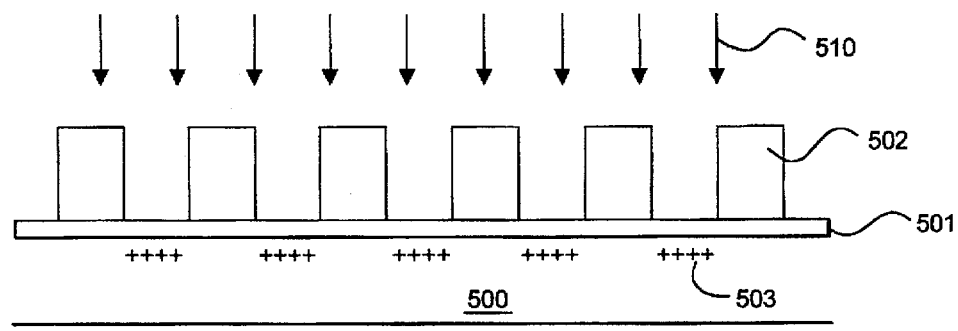
FIGS. 12–18 show the sequence of fabrication steps and devices of an embodiment of the present invention.

FIG. 12 shows the fabrication of the bitline pattern and the sacrificial insulators above the bitlines. First, silicon substrate 500 is provided. As is well known in the art, the substrate is made of silicon with impurities predeposited therein. The predeposition is accomplished through heating the silicon wafer at elevated temperatures and introducing a gas of the impurity over the silicon wafer. Alternatively, ion implantation may be used for the predeposition step.

Figure 13:
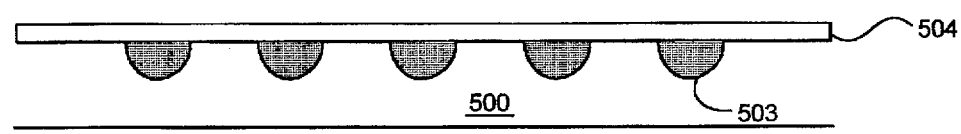

Sacrificial insulator layer 501 of height 50 to 500 Å (angstroms) is formed or fabricated on the substrate 500. A photoresist layer 502 is placed on the sacrificial insulator layer 501 to ultimately provide the bitline pattern. A separate mask is then used to define the bitline pattern and a reacting element, such as ultraviolet (UV) light, is then provided to the exposed photoresist layer 502 beneath the mask. The exposed portions of the photoresist layer 502 is then removed. Using the remaining photoresist as a mask, ions are implanted into the substrate through the bitline-patterned exposed areas to define the buried diffusion bitlines. In one example, arsenic ion implantation is used to implant ions into the silicon substrate 500. Buried diffusion n+ bitlines 503 are formed. The photoresist 502 is then stripped away, leaving only the sacrificial insulator 501, bitlines 503, and substrate 500. The sacrificial insulator is also stripped away prior to the next step. As shown in FIG. 13, gate oxide 504 is fabricated on top of the buried diffusion bitlines 503 and the substrate.

Figure 14:
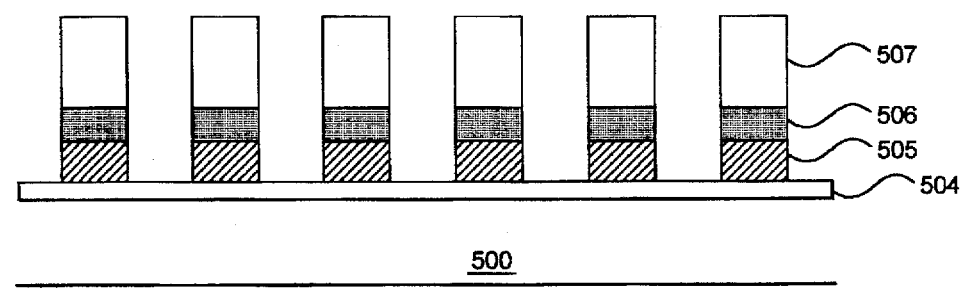

FIG. 14 shows the fabrication of the polysilicon wordlines and end point detection layers. FIG. 14 is also a side view from a direction rotated 90 degrees from that of FIGS. 12 and 13. Thus, instead of viewing the columns of bitlines 503 (as shown in FIGS. 12 and 13), the rows of wordlines are viewed in FIG. 14. These wordlines are fabricated perpendicular to the columns of bitlines.

In FIG. 14, the substrate 500 and gate oxide layer 504 from the previous step are used. First, a polysilicon layer 505, with a height between 1500 to 6000 Å above the substrate is deposited by chemical vapor deposition. Chemical vapor deposition is also used to deposit an end point detection layer 506, with a height of 1000 to 6000 Å above the polysilicon layer 505. The end point detection layer 506 can be silicon nitride or silicon dioxide. A photoresist layer 507 is then provided on top of the end point detection layer 506. Thus, only the photoresist layer 507 can be viewed from a direction orthogonal to the substrate 500.

Upon preparing the polysilicon layer 505, end point detection layer 506, and photoresist layer 507, an appropriately-patterned mask is used to define the specific polysilicon wordline pattern 505. UV light is then provided to the mask and the exposed photoresist layer 507. When the UV exposure is completed, the polymerized photoresist is removed to define the wordline pattern. The desired wordline pattern can then be formed by dry etching. FIG. 14 shows the resulting fabrication. The remaining photoresist layers 507 can then be removed by cleaning with water or other techniques known in the art.

FIGS. 15–20 show the ion barrier walls in accordance with the present invention. These figures are not drawn to scale; rather, they serve to illustrate the principles of the present invention. Thus, the widths of the ion barrier walls are not necessarily equal to the widths of the wordlines. In addition, the spacing between wordlines and bitlines vary depending on the particular application and density required. Typically, the ROM array utilizes channel regions of 0.6 μm or less.

Figure 15:
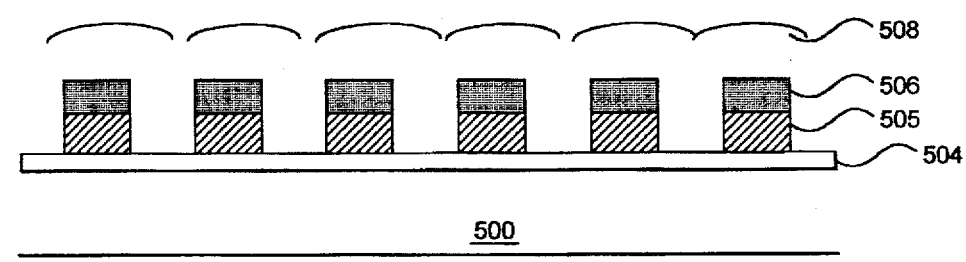
Figure 16:
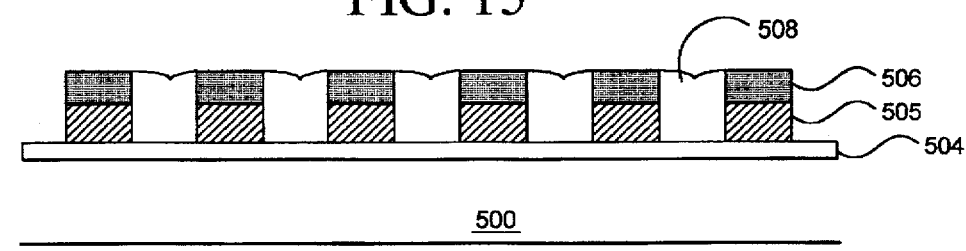

FIGS. 15 and 16 show the formation of the ion barrier layer to provide the high ion barrier walls of the present invention. In FIG. 15, chemical vapor deposition is used to deposit an ion barrier layer 508, such as silicon dioxide or silicon nitride, on top of and around the end point detection layer 506 and polysilicon wordline 505 from the previous step. Dry etching is then used to etch back the ion barrier layer 508 to a height substantially equivalent to the level of the end point detection layer 506, as shown in FIG. 16. Accordingly, ion barrier walls are formed among the wordlines by the remaining ion barrier layer 508. In this example, these walls are each at least 1000 Å higher than the height of the polysilicon wordline 505.

Figure 17:
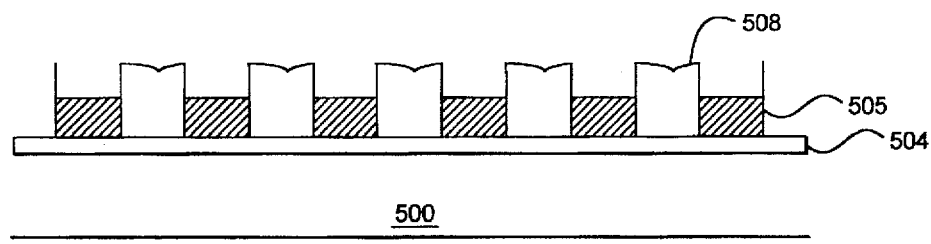

FIG. 17 shows the remaining layers after the end point detection layer 506 has been removed by dry etching or wet etching. The ion barrier walls formed from the previous steps with the ion barrier layer 508 are now expressly shown without the end point detection layers 506. Thus, from a view orthogonal to the substrate 500, only the ion barrier walls 508 and wordlines 505 are visible.

FIG. 18 shows the code ion implantation step when utilizing the high ion barrier walls of the present invention. The photoresist layers 509 are used to mask those channel regions of selected memory cells to be protected from the implantation by the ions 510. With these high ion barrier walls 508, more contact surface area is provided to the photoresist masks 509, preventing their peeling and improving adhesion of the photoresist masks 509 and the layer beneath.

FIGS. 19 and 20 show the advantages of the present invention. When the photoresist masks 511 are misaligned, as shown in FIG. 19, the implanted ions are nevertheless still provided to the channel regions of selected memory cells under the polysilicon wordlines 505. The high ion barrier walls 508 prevent ions from implanting in channel regions of memory cells not selected for ion implants.

In FIG. 20, despite the smaller size of the photoresist masks 512, proper ion implantation occurs nevertheless, in accordance with the present invention. The high ion barrier walls 508 prevent ions from implanting in channel regions of memory cells not selected for ion implants. Thus, photoresist mask misalignment and critical dimension variations do not prevent the proper code programming of the mask ROM arrays.

For example, a properly aligned and sized mask, as shown in FIG. 18, results in a code program of logic 0, 1, 0, 1, 1, and 0 of memory cells 520–525, respectively. The ions 1801–1803 are implanted only in selected memory cells 520, 522, and 525. When the mask is misaligned, as shown in FIG. 19, the present invention provides proper code programming via ion implants in selected channel regions. Thus, memory cells 520–525 will store logic 0, 1, 0, 1, 1, and 0, respectively. Only memory cells 520, 522, and 525 are implanted with ions 1901–1903. When the masks are sized too small, as shown in FIG. 20, the present invention nevertheless assures proper code programming. Thus, memory cells 520–525 will store logic 0, 1, 0, 1, 1, and 0, respectively. Only memory cells 520, 522, and 525 are implanted with ions 2001–2003. The impact of lateral scattering on the ion implantation step is minimized.

In essence, the high ion barrier walls 508 provide self-alignment via a larger process window during the code programming process. Code ion implantation is limited to the channel regions of selected memory cells not covered by the photoresist mask. The ion barrier walls prevent ions from penetrating through during code programming and increase the processing window despite mask misalignment and critical dimension variation. These walls also provide the photoresist with additional contact area for adhesion. Without the present invention, misalignment of the masks, as shown in FIG. 9, and variations in the photoresist critical dimensions, as shown in FIGS. 10 and 11, result in improper code ion implantation and, hence, lower die yield. Even if the code programming is correct, varying channel widths resulting in varying channel resistances can affect peripheral circuits, such as sense amplifiers, from performing optimally.

As discussed above, the present invention improves the mask ROM code programming process with an alignment structure which has a selective effect on this code programming process. Thus, misalignment of masks or critical dimension variations are corrected with the self-alignment benefits of the present invention. The alignment structures also have a selective effect on various other processes by promoting self-alignment. One example is the process of forming a via cut.

Figure 21:
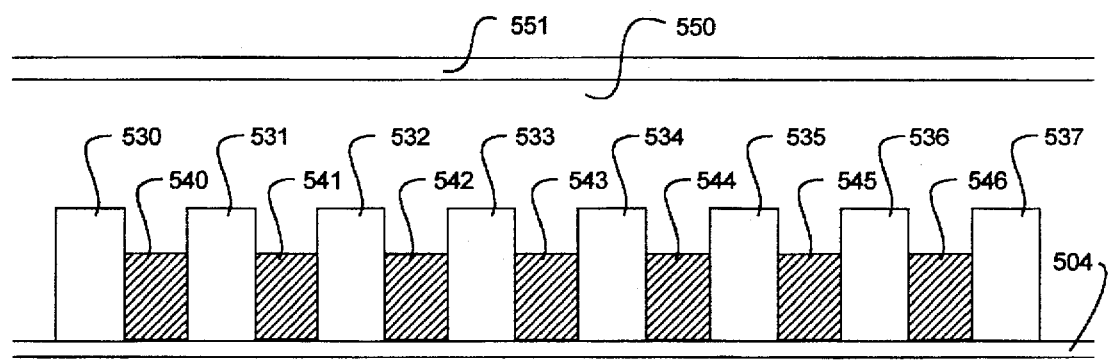
FIGS. 21 and 22 show how the present invention improves the process of forming a via cut.

FIG. 21 shows the alignment structures 530–537 in gaps between the polysilicon wordlines 540–546 after applying the steps described above (corresponding to FIGS. 12–17). These alignment structures 530–537 and polysilicon wordlines 540–546 are resting on an insulator layer 504 and substrate 500. Wordline 540–546 can also be a first layer of metal contact. Furthermore, FIG. 21 also shows the deposited dielectric such as phosphorous-doped silicon dioxide or borophosphosilicate glass (BPSG) 550 over the patterned conducting layer below. To smooth the irregular dielectric surface, planarization techniques known to those ordinarily skilled in the art can be utilized by spinning a photoresist or other polymeric layer 551 onto the dielectric layer. The smoother surface of the polymeric layer 551 is transferred to the dielectric layer by etching in a reactive plasma that etches the polymeric layer 551 and the dielectric layer 550 at the same rate.

Figure 22:
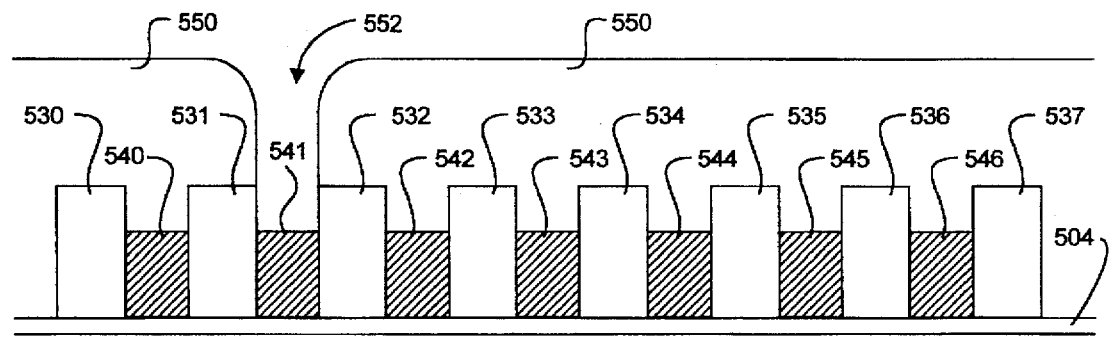

As shown in FIG. 22, via cut or hole 552 can be formed to contact a lower layer metal contact, such as metal 541, by methods known in the art. However, the presence of alignment structures 530–537, formed in accordance with the present invention, promotes self-alignment of the proper formation of the via hole 552. Thus, the via hole 552 is formed in the proper location with guidance from the alignment structure 531, 532 without affecting other layers to allow a subsequent metal to metal connection.

Figure 23:
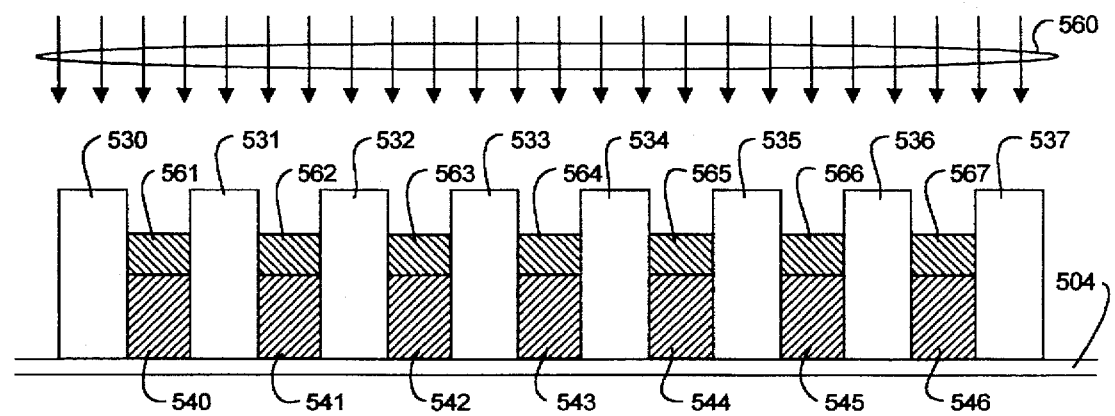

FIG. 23 shows the advantages of the present invention in improving the polycide process. As is well known to those ordinarily skilled in the art, the polycide process forms composite layered structures of refractory metal silicides (e.g., $WSi_2$, $TiSi_2$, $MoSi_2$, or $TaSi_2$) over doped polysilicon for the MOS gates because of the added electrical conductivity of the metal silicide layer. Alternatively, refractory metals (e.g., W, Ta, or Mo) or refractory metal silicides can be used in place of the polysilicon structure.

After the formation of the alignment structures 530–537 (see FIGS. 12–17) in gaps between the polysilicon wordlines 540–546, a material 560 such as tungsten is deposited over the patterned features. The metal silicides 561–567 are formed on the polysilicon wordlines 540–546 without affecting other layers. The alignment structures 530–537 provide self alignment of the deposited material so that despite misalignment of any masks or the patterned features or lower critical dimensions, the material will be deposited over the polysilicon wordlines 540–546.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. Thus, the present invention provides improvements to other processes where selectivity and alignment are significant factors. It is intended that the scope of the invention be defined by the following claims and their equivalents.

What is claimed is:

1. A method of forming a read-only-memory (ROM) array in preparation for code programming the ROM array with a mask, comprising:

forming a plurality of bitlines on a substrate;

forming a plurality of wordlines orthogonal to the plurality of bitlines;

forming a plurality of ion barrier elements between the plurality of wordlines in the ROM array, the ion barrier elements inhibiting ions from penetrating through and into the substrate between the plurality of wordlines during code programming; and applying a code programming mask over the plurality of ion barrier elements in the ROM array after the plurality of ion barrier elements is formed.

2. The method of claim 1, wherein the step of forming the plurality of wordlines includes:

forming an insulator layer on the plurality of bitlines and the substrate;

forming a wordline layer on the insulator layer;

forming an end point detection layer on the wordline layer;

forming a photoresist layer on the end point detection layer;

exposing the photoresist layer with a reacting element through a second mask to define a wordline pattern;

forming the plurality of wordlines and a plurality of end point detection elements on the plurality of wordlines based on the wordline pattern; and removing the photoresist layer.

3. The method of claim 1, wherein the step of forming the ion barrier elements includes:

aligning the ion barrier elements between the plurality of wordlines such that the ion barrier elements are in contact with the plurality of wordlines.

4. The method of claim 3, wherein the step of aligning includes:

facilitating self-alignment of ion implants in selected channel regions during code programming to reduce code programming errors and establish programmed threshold voltage levels in the selected channel regions.

5. The method of claim 3, wherein the step of aligning includes:

facilitating self-alignment of ion implants in selected channel regions during code programming to provide more uniform channel widths among similarly coded channel regions.

6. The method of claim 1, wherein the step of forming the ion barrier elements includes:

providing increased contact area on the ion barrier element for the code programming mask which increases adhesion to reduce peeling of the code programming mask.

7. The method of claim 2, wherein the step of forming the ion barrier elements includes:

forming an ion barrier layer over and between the plurality of wordlines and the plurality of end point detection elements, the ion barrier layer at a first height greater than a height of the plurality of wordlines measured from the substrate; and removing a portion of the ion barrier layer to form the ion barrier elements between the plurality of wordlines and expose the plurality of wordlines when viewed from a direction orthogonal to the substrate, the ion barrier element at a second height that is at least equal to the height of the plurality of wordlines when measured from the substrate.

8. The method of claim 7, wherein the step of removing a portion of the ion barrier layer includes:

removing the ion barrier layer until the plurality of end point detection elements are exposed when viewed from the direction orthogonal to the substrate; and removing the plurality of end point detection elements to expose the plurality of wordlines when viewed from the direction orthogonal to the substrate.

9. The method of claim 7, wherein the second height is at least 1000 Angstroms greater than the height of the plurality of wordlines when measured from the substrate.

10. A method of forming a read-only-memory (ROM) array in preparation for code programming the ROM array with a mask, comprising:

forming a plurality of bitlines on a substrate;

forming a plurality of wordlines orthogonal to the plurality of bitlines;

forming an ion barrier layer over and between the plurality of wordlines and the plurality of end point detection elements, the ion barrier layer at a first height greater than a height of the plurality of wordlines measured from the substrate;

removing a portion of the ion barrier layer to form a plurality of ion barrier elements between the plurality of wordlines and expose the plurality of wordlines when viewed from a direction orthogonal to the substrate, the ion barrier element at a second height that is greater than the height of the plurality of wordlines when measured from the substrate; and applying a code programming mask over the plurality of ion barrier elements in the ROM array after the plurality of ion barrier elements is formed.

11. The method of claim 10, wherein the step of forming the ion barrier elements includes:

aligning the ion barrier elements between the plurality of wordlines such that the ion barrier elements are in contact with the plurality of wordlines.

12. The method of claim 11, wherein the step of aligning includes:

facilitating self-alignment of ion implants in selected channel regions during code programming to reduce code programming errors and establish programmed threshold voltage levels in the selected channel regions.

13. The method of claim 11, wherein the step of aligning includes:

facilitating self-alignment of ion implants in selected channel regions during code programming to provide more uniform channel widths among similarly coded channel regions.

14. The method of claim 10, wherein the step of forming the ion barrier elements includes:

providing increased contact area on the ion barrier element for the code programming mask which increases adhesion to reduce peeling of the code programming mask.

15. The method of claim 10, wherein the step of removing a portion of the ion barrier layer includes:

removing the ion barrier layer until the plurality of end point detection elements are exposed when viewed from the direction orthogonal to the substrate; and removing the plurality of end point detection elements to expose the plurality of wordlines when viewed from the direction orthogonal to the substrate.

* * * * *